(12) United States Patent
Gomes et al.

(10) Patent No.: US 11,652,060 B2
(45) Date of Patent: May 16, 2023

(54) DIE INTERCONNECTION SCHEME FOR PROVIDING A HIGH YIELDING PROCESS FOR HIGH PERFORMANCE MICROPROCESSORS

(71) Applicant: Intel Corporation, Santa Clara, CA (US)

(72) Inventors: Wilfred Gomes, Portland, OR (US); Mark Bohr, Aloha, OR (US); Rajabali Koduri, Hillsboro, OR (US); Leonard Neiberg, Portland, OR (US); Altug Koker, El Dorado Hills, CA (US); Swaminathan Sivakumar, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 950 days.

(21) Appl. No.: 16/236,228

(22) Filed: Dec. 28, 2018

(65) Prior Publication Data
US 2020/0211970 A1 Jul. 2, 2020

(51) Int. Cl.
*H01L 23/48* (2006.01)
*H01L 23/52* (2006.01)
(Continued)

(52) U.S. Cl.
CPC .......... *H01L 23/5386* (2013.01); *H01L 21/78* (2013.01); *H01L 22/20* (2013.01); *H01L 23/528* (2013.01); *H01L 24/16* (2013.01); *H01L 24/24* (2013.01); *H01L 24/73* (2013.01); *H01L 24/94* (2013.01); *H01L 25/18* (2013.01); *H01L 23/481* (2013.01); *H01L 2224/16145* (2013.01); *H01L 2224/24137* (2013.01); *H01L 2224/73209* (2013.01)

(58) Field of Classification Search
CPC combination set(s) only.
See application file for complete search history.

(56) References Cited

U.S. PATENT DOCUMENTS 8,546,187 B2 * 10/2013 Koide ................. H01L 25/0655
257/685
10,163,798 B1 12/2018 Alur
(Continued)

FOREIGN PATENT DOCUMENTS

EP 2234158 * 9/2010
EP 2234158 A1 * 9/2010 ............ H01L 24/17
WO WO 2013/119309 8/2013

OTHER PUBLICATIONS

Search Report from European Patent Application No. 19211025.2, dated Mar. 5, 2020, 10 pages.

*Primary Examiner* — Niki H Nguyen
(74) *Attorney, Agent, or Firm* — Schwabe, Williamson & Wyatt, P.C.

(57) ABSTRACT

A method is disclosed. The method includes a plurality of semiconductor sections and an interconnection structure connecting the plurality of semiconductor sections to provide a functionally monolithic base die. The interconnection structure includes one or more bridge die to connect one or more of the plurality of semiconductor sections to one or more other semiconductor sections or a top layer interconnect structure that connects the plurality of semiconductor sections or both the one or more bridge die and the top layer interconnect structure.

20 Claims, 12 Drawing Sheets

(51) Int. Cl.
    *H01L 29/40*         (2006.01)
    *H01L 23/538*      (2006.01)
    *H01L 21/78*        (2006.01)
    *H01L 21/66*        (2006.01)
    *H01L 23/528*      (2006.01)
    *H01L 23/00*        (2006.01)
    *H01L 25/18*        (2023.01)

(56) References Cited

U.S. PATENT DOCUMENTS

| | | |
|---|---|---|
| 2002/0157082 A1 | 10/2002 | Shau |
| 2008/0009124 A1 | 1/2008 | Ishino |
| 2009/0267238 A1* | 10/2009 | Joseph .............. H01L 23/49833 438/109 |
| 2010/0327424 A1* | 12/2010 | Braunisch ............... H01L 24/73 257/692 |
| 2013/0168854 A1* | 7/2013 | Karikalan ............... H01L 24/73 257/784 |
| 2015/0008954 A1 | 1/2015 | Camarota |
| 2015/0028486 A1* | 1/2015 | Liu .................... H01L 23/5389 257/773 |
| 2017/0125396 A1 | 5/2017 | Shao |
| 2018/0028486 A1* | 2/2018 | Su ........................ A61K 9/5192 |

\* cited by examiner

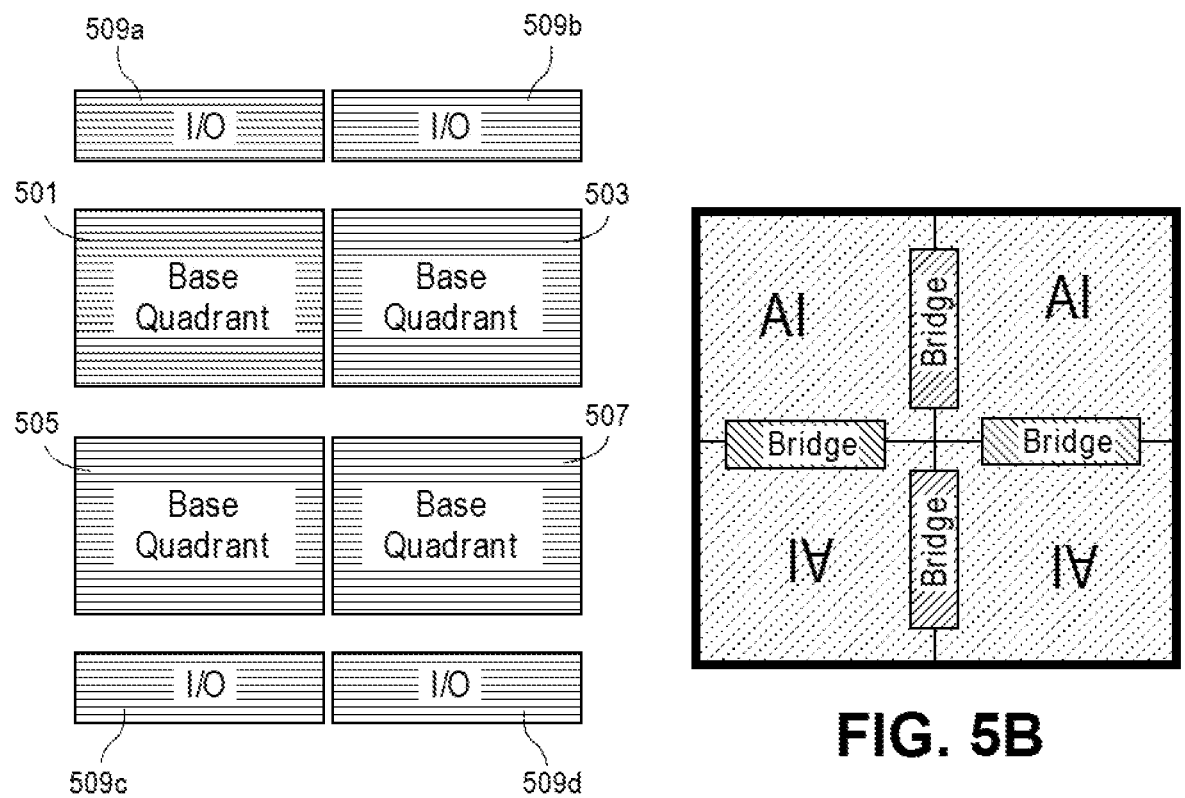
FIG. 5A
FIG. 5B
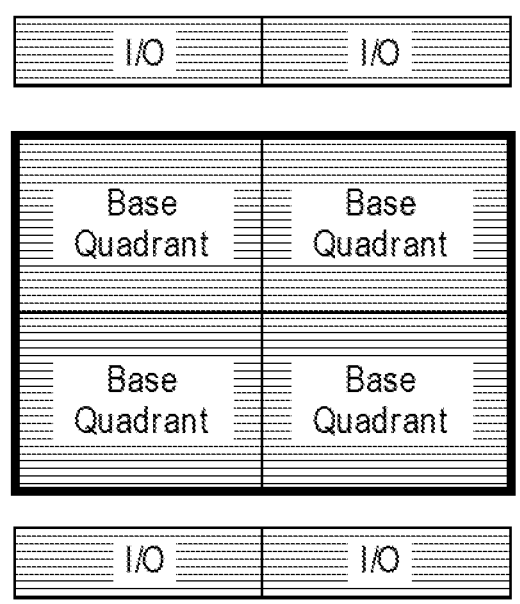
FIG. 5C

DIE INTERCONNECTION SCHEME FOR PROVIDING A HIGH YIELDING PROCESS FOR HIGH PERFORMANCE MICROPROCESSORS

TECHNICAL FIELD

Embodiments of the disclosure pertain to providing a high yielding process for high performance microprocessors and, in particular, to a die interconnection scheme for providing a high yielding process for high performance microprocessors.

BACKGROUND

Fabricating high performance microprocessors in a low yielding process presents significant challenges to chip designers. High performance microprocessor architectures can include very high numbers of interconnected compute and network elements. The larger the contiguous silicon area, the greater the challenge (exponentially so) of yielding a fully functional die. The large size of the network part of high performance microprocessor architectures result in large total die area. Consequently, large size network elements are difficult to yield, especially in a relatively low yielding manufacturing process.

Rapid product lifecycles and high development costs pressure manufacturing firms to cut not only their development times (time-to-market), but also the time to reach full capacity utilization (time-to-volume). The period between completion of development and full capacity utilization is known as production ramp-up. During that time, new production processes are not well understood, and contributes to low yields and low production rates. However, because of the aforementioned pressures some yield is required during early ramp-up and debug phases. Conventional approaches to addressing yield and performance in high performance microprocessor development rely upon packaging techniques or embedded bridges. These approaches come with large power and performance penalties. Accordingly, many useful high performance microprocessor architecture designs cannot be built using current approaches.

BRIEF DESCRIPTION OF THE DRAWINGS

FIGS. 5A-5C illustrate a situation where a top layer interconnection structure is used and a situation where bridge die are used to connect base die sections according to an embodiment.

DESCRIPTION OF THE EMBODIMENTS

Figure 1:
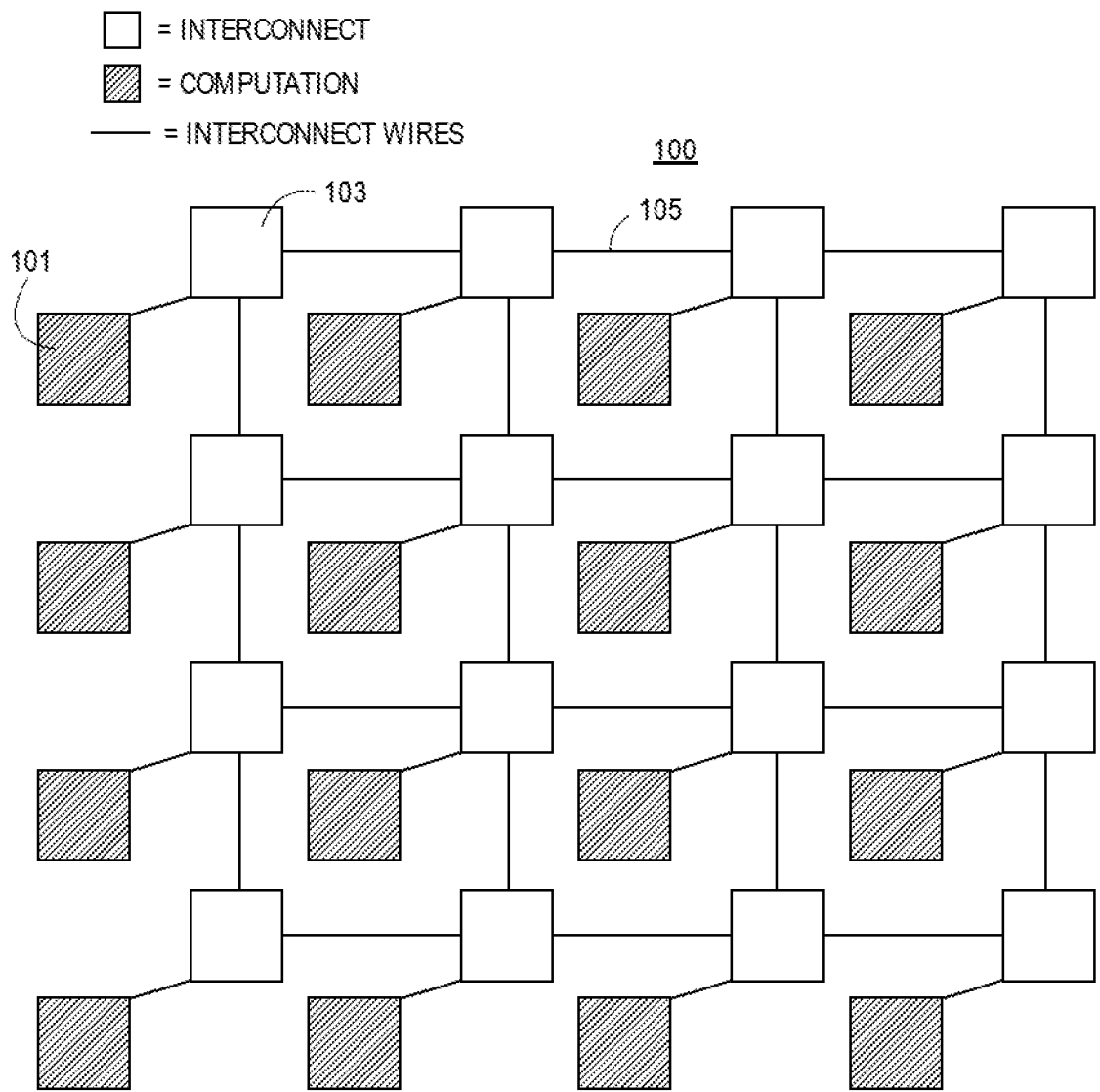
FIG. 1 is an illustration of an example graphics, server, field programmable gate array (FPGA), artificial intelligence (AI), system on chip (SOC) or other large architecture.

A die interconnection scheme for providing a high yielding process for high performance microprocessors is described. It should be appreciated that although embodiments are described herein with reference to example die interconnection schemes for providing a high yielding process for high performance microprocessors, the disclosure is more generally applicable to die interconnection schemes for providing a high yielding process for high performance microprocessors as well as other type die interconnection schemes for providing a high yielding process for high performance microprocessors. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Rapid product lifecycles and high development costs pressure manufacturing firms to cut not only their development times (time-to-market), but also the time to reach full capacity utilization (time-to-volume). The period between completion of development and full capacity utilization is known as production ramp-up. During that time, new production processes are not well understood, and contributes to low yields and low production rates. However, because of the aforementioned pressures some yield is required during early ramp-up and debug phases. Conventional approaches to addressing yield and performance in high performance microprocessor development rely upon packaging techniques or embedded bridges. These approaches come with large power and performance penalties. Moreover, their large die requirements can impose prohibitive limits on yield and die size. Accordingly, many useful high performance microprocessor architecture designs cannot be built using current approaches.

An approach that addresses the shortcomings of previous approaches is disclosed herein. For example, as part of a disclosed process, a high performance microprocessor design is broken into parts. In particular, the compute portion of the design is broken into parts and placed on smaller high performance die and the network portion of the design is broken into parts and placed on respective base die sections. During the fabrication of the base die, stitch wires are used to connect interconnect structures of the severable base die sections onto which the parts of the network circuitry are placed such that a functionally monolithic base die can be formed from the base die sections. In an embodiment, the blocks of the network circuitry that are unique are abstracted out and placed on small chiplets. These chiplets can be connected to die by micro-bumps (formed from conductive material). In an embodiment, the chiplets can be used as redundant bridge die to connect individual base die sections taken from different parts of a wafer such that a functionally monolithic base die can be constructed from such individual base die sections. During the low yield phase of production ramp up, the bridge die are used to provide a base die constructed in whole, or in part, from individual base die sections that provides a level of performance that is desired by some customers. During the high yield phase of production ramp up, the bridge chips do not have to be used and the stitch wires may be used to provide a base die formed from a single semiconductor block that provides 10 times higher bandwidth between the dies than is provided by conventional bridge die. As a result, in an embodiment, during early production ramp up and debug of parts, one or more bridge die can be used to construct a version of the design that enables the provision of required yield. Moreover, during high volume production ramp up, interconnect stitching can be used to provide a higher performance version of the design. Thus, valuable microprocessor architectures can be built that cannot be built using conventional techniques because of the prohibitive limits imposed on yield and die size by their large base die requirement. Embodiments are applicable to graphics, server, Artificial Intelligence (AI), Field Programmable gate array (FPGA) logic, System on Chip (SOC) and other microprocessor architectures.

FIG. 1 is an illustration of a conventional microprocessor architecture 100. The microprocessor architecture 100 shown in FIG. 1 is typical of graphics or server architectures. In the FIG. 1 example, the microprocessor architecture 100 includes computation elements 101, interconnect (e.g., network) elements 103 and interconnect wires 105. Referring to FIG. 1 the interconnect elements 103 are connected to a plurality of other interconnect elements 103 and to individual computation elements 101 by interconnect wires 105. The computation elements 101 can be formed using the latest generation process technology (N) and the interconnect elements 103 can be formed using a previous generation process technology (N−1).

It should be appreciated that because the microprocessor architecture 100 is very large, attempts to fabricate the microprocessor architecture 100 using conventional approaches can result in a low yielding production process. In order to increase yield, the design can be separated into parts in order to effect a higher yielding production process. Because the fabrication of the computation elements 101 can involve a lower yielding production process than does the fabrication of the interconnect elements 103, the design can be separated along computation and interconnect component lines. For example, the computation elements 101 and the interconnect elements 103 can be fabricated on separate die. However, because the interconnection portion of the microprocessor architecture 100 is itself very large, and the fabrication of such as a monolithic structure can result in a low yielding production process, the interconnect elements 101 of the microprocessor architecture 100 can themselves can be fabricated on individual die.

Figure 2A:
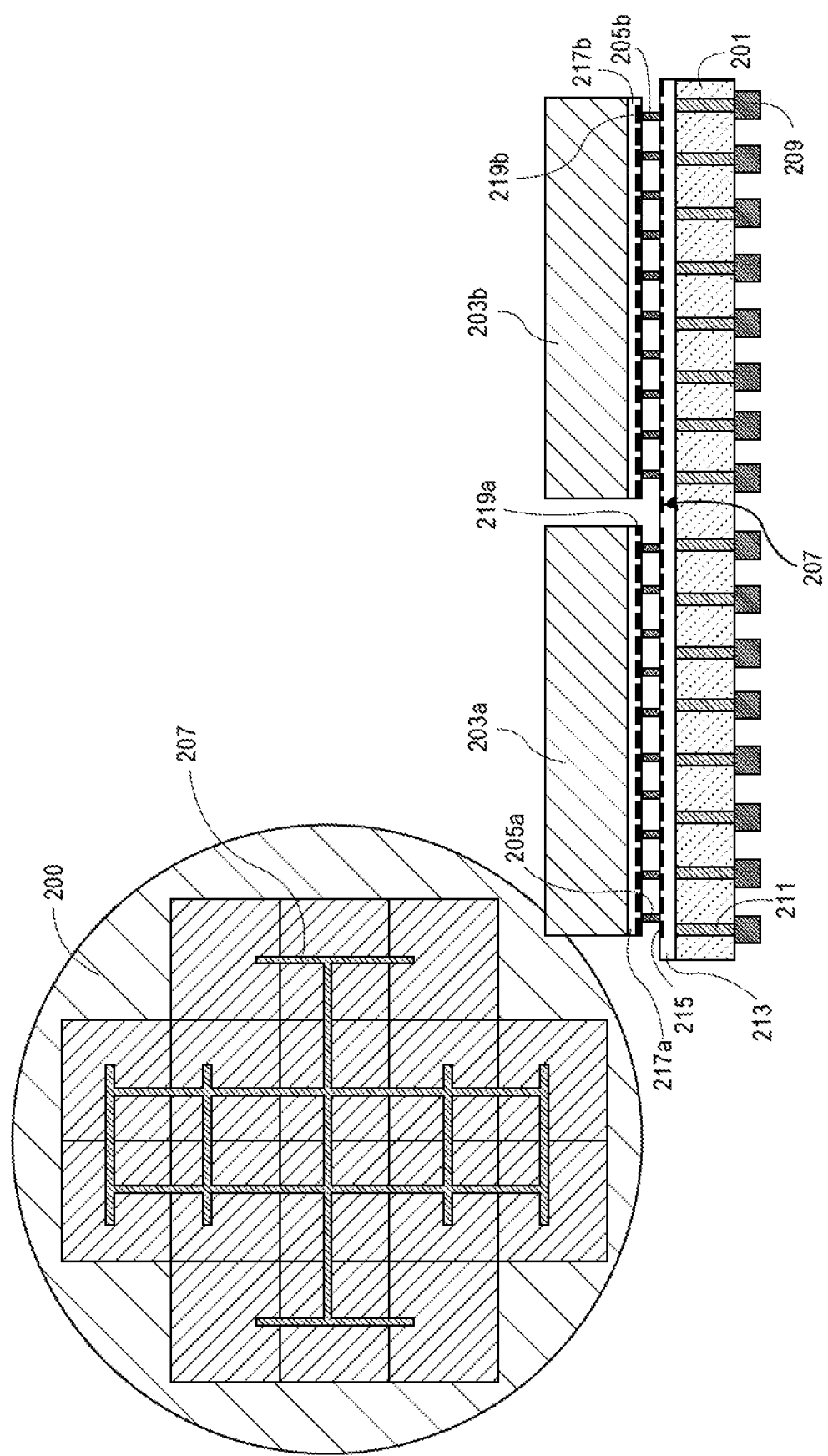
FIG. 2A illustrates the manner in which a large architecture can be separated into computation and interconnect components according to a previous approach.

FIG. 2A illustrates the manner in which a microprocessor architecture such as that shown in FIG. 1 can be separated into computation and interconnect components according to a previous approach. FIG. 2A shows a wafer 200 and a cross-section of a portion of the wafer 200 that includes a plurality of computation die that include computation components of the large microprocessor architecture mounted on a base die that includes interconnect components of the large microprocessor architecture thereon according to a previous approach. The cross-section of the portion of the wafer 200 shown in FIG. 2A includes base die 201, first computation die 203a, second computation die 203b, bumps 205a and 205b, interconnect network 207, bumps 209, vias 211, active device layer 213, conductive layers 215, active device layer 217a, active device layer 217b, conductive layer 219a and conductive layer 219b.

Referring to FIG. 2A, the base die 201 is formed underneath the first computation die 203a and second computation die 203b. The bumps 205a and 205b are formed on the base die 201 and connect the base die 201 to the first computation die 203a and the second computation die 203b respectively. The interconnect network 207 is formed as a part of the conductive layers 215 and includes interconnect elements and is connected to computation elements. The bumps 209 are formed below the base die 201 and enable the base die 201 to be connected to external circuitry (e.g., circuitry of a package substrate). The vias 211 are formed in the base die 201. In an embodiment, the vias 211 are vertical interconnection structures that facilitate electrical interconnection. The active device layer 213 is formed on the base die 201 and includes active devices (as does other active device layers 217a and 217b). The conductive layers 215 are formed on the active device layer 213. In an embodiment, the conductive layers 215 facilitate electrical connection to external connection components (as does other conductive layers 219a and 219b). The active device layer 217a is formed on the first computation die 203a. The active device layer 217b is formed on the second computation die 203b. The conductive layer 219a is formed on the active device layer 217a. The conductive layer 219b is formed on the active device layer 217b.

Figure 2B:
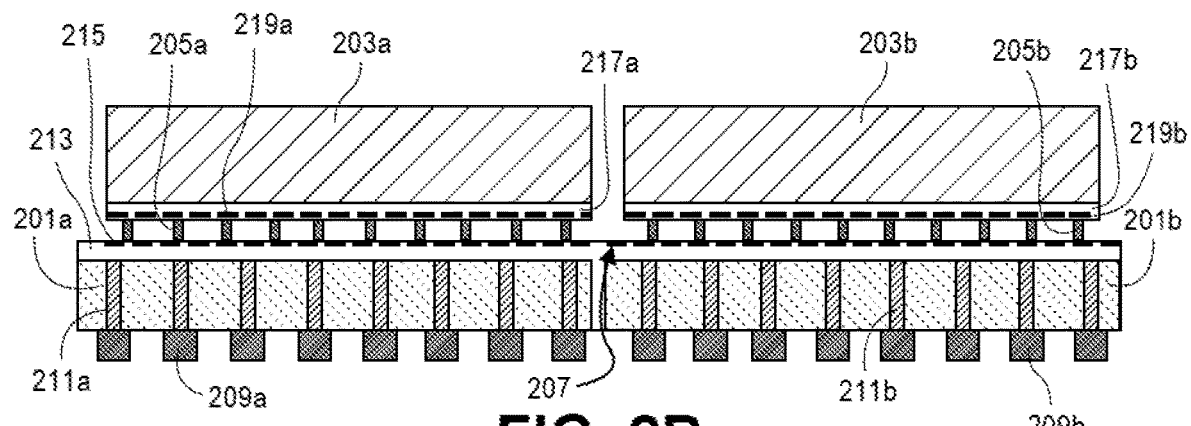
FIG. 2B illustrates the manner in which a base die can be separated into a first base die section and a second base die section.

Thus, FIG. 2A illustrates a manner in which the networking and computation components of a large microprocessor architecture can be separated where its interconnect (networking) components are formed on the base die 201 and its computation components are formed on the computation die 203a and 203b. However, because the networking components of the base die 201 can be very large, the base die 201 may need to be separated such that the resulting die sections can be accommodated by a reticle in a manner that addresses yield and cost considerations. FIG. 2B illustrates a manner in which the base die 201 of FIG. 2A, can be separated into a first base die section 201a and a second base die section 201b. In FIG. 2B, the first base die section 201a includes bumps 209a and vias 211a and the second base die section 201b includes bumps 209b and vias 211b. These and other components of FIG. 2B function similarly to their counterparts in FIG. 2A and thus a description of their function is not repeated here for purposes of clarity and brevity. The separation of the die into a plurality of smaller sections produces die of reduced size that are patterned using masks that can fit into reticles of standard size such that yield and cost considerations are addressed.

Figure 2C:
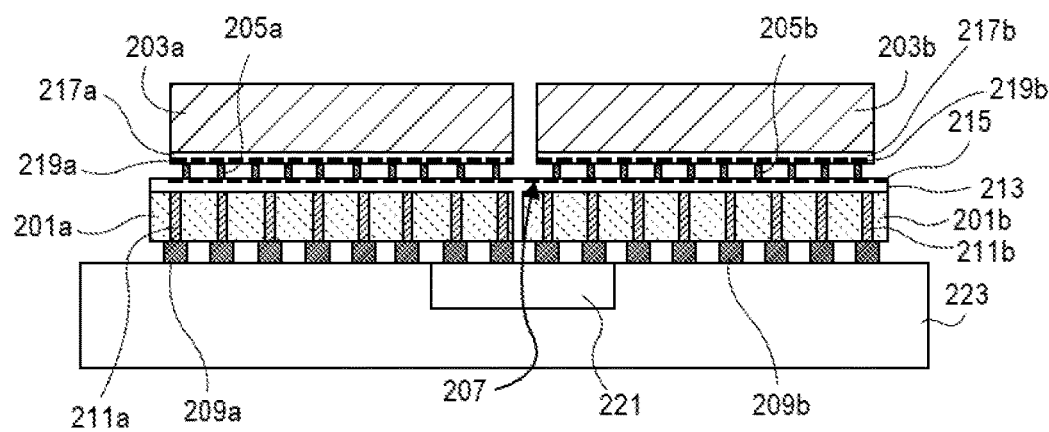
FIG. 2C illustrates the manner in which a first base die section and a second base die section can be connected by a bridge die.
Figure 2D:
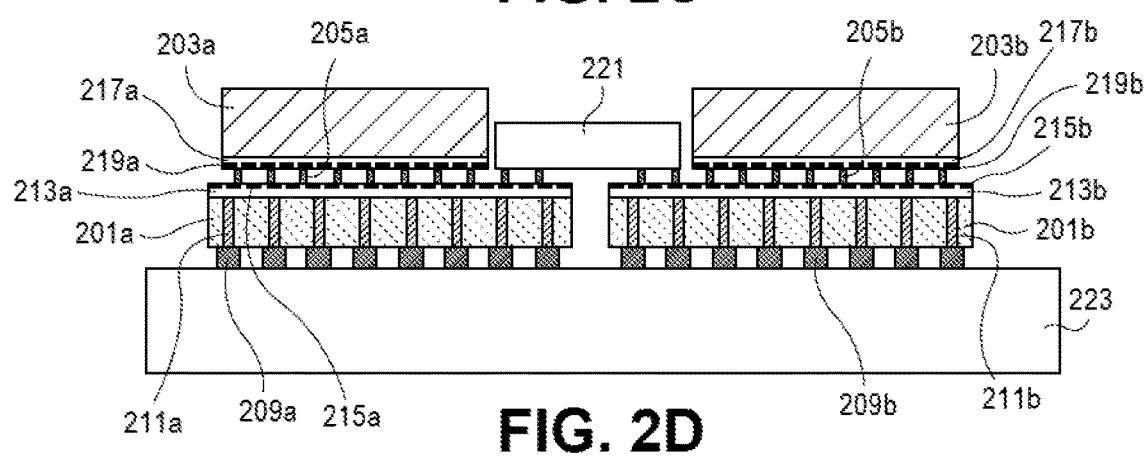
FIG. 2D illustrates another manner in which a first base die section and a second base die section can be connected by a bridge die.

FIG. 2C shows a manner in which the first base die section 201a and the second base die section 201b can be connected by a bridge die 221 in a previous approach. Referring to FIG. 2C, in a first example, the bridge die 221 is formed in a package substrate 223. Furthermore, the first base die section 201a and the second base die section 201b are formed on the package substrate 223 and are connected by the bridge die 221. FIG. 2D shows another manner in which the first base die section 201a and the second base die section 201b can be connected by the bridge die 221 in a previous approach. FIG. 2D shows in addition to common structures shown in FIG. 2C, active layer 213a, active layer 213b, conductive layers 215a and conductive layers 215b. These and other components of FIG. 2D function similarly to their counterparts in FIG. 2C and thus a description of their function is not repeated here for purposes of clarity and brevity. Referring to FIG. 2D, the bridge die 221 is connected to bumps above a top surface of the first base die section 201a and above a top surface of the second base die section 201b and forms a bridge that communicatively couples the first base die section 201a and the second base die section 201b. It should be appreciated that the bridge die connection approaches illustrated in FIGS. 2C and 2D provide a ten times lower bandwidth than monolithic die architectures. In addition, these approaches can involve die wastage on the base die due to the addition of mesh or interconnect input and output circuitry which can increase the cost of the base die.

In contrast to the approaches described hereinabove, in an embodiment, a die structure is provided that is in a first phase of production ramp up designed to use bridge die to connect individual base die sections that are identified as functional to one or more other base die sections identified as functional in order to provide a functionally monolithic base die, and is in a second phase of production ramp up designed to use an interconnect structure to connect severable but intact base die sections together when adjacent base die sections are identified as functional. In an embodiment, because of the aforementioned die architecture, functionally monolithic base dies can be provided during both the low yield and the high yield phases of production ramp up, through the use of bridge die and stitched interconnect structures, respectively. The embodiments that include these features are described in detail with reference to FIGS. 3A-3C, FIGS. 4A-4C and FIGS. 5A-5C below.

Figure 3A:
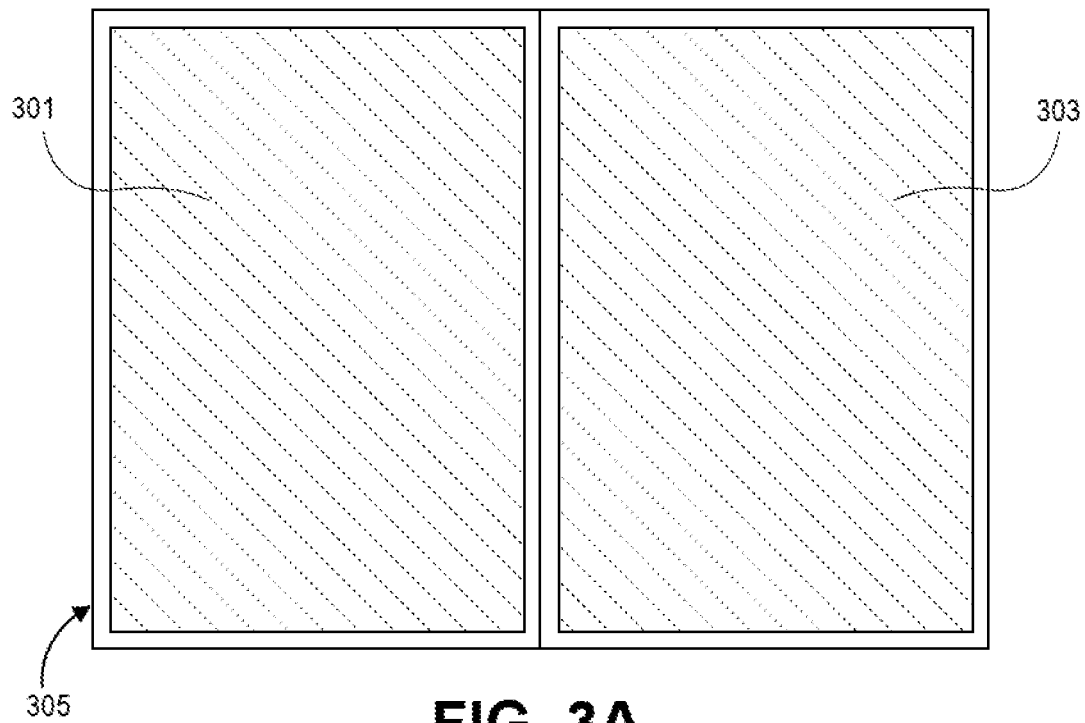
FIGS. 3A-3C illustrate the formation of a top layer interconnection structure used to connect base die sections to form a functionally monolithic base die according to an embodiment.
Figure 3B:
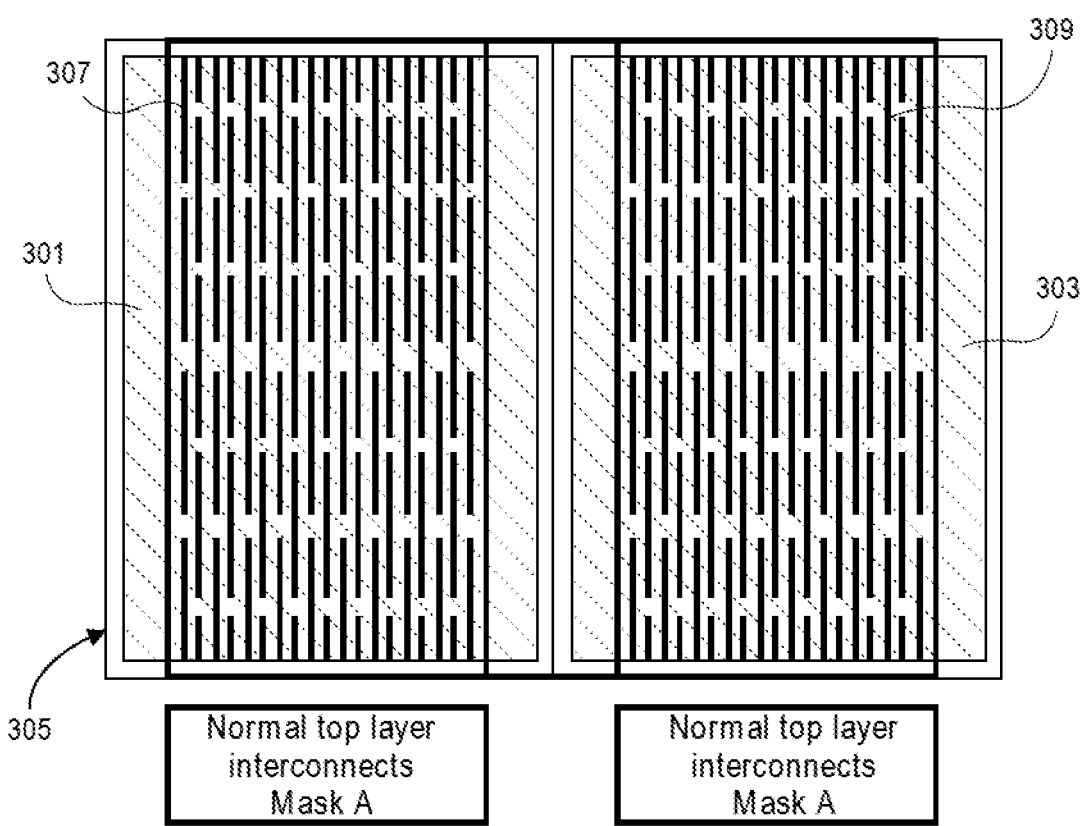
Figure 3C:
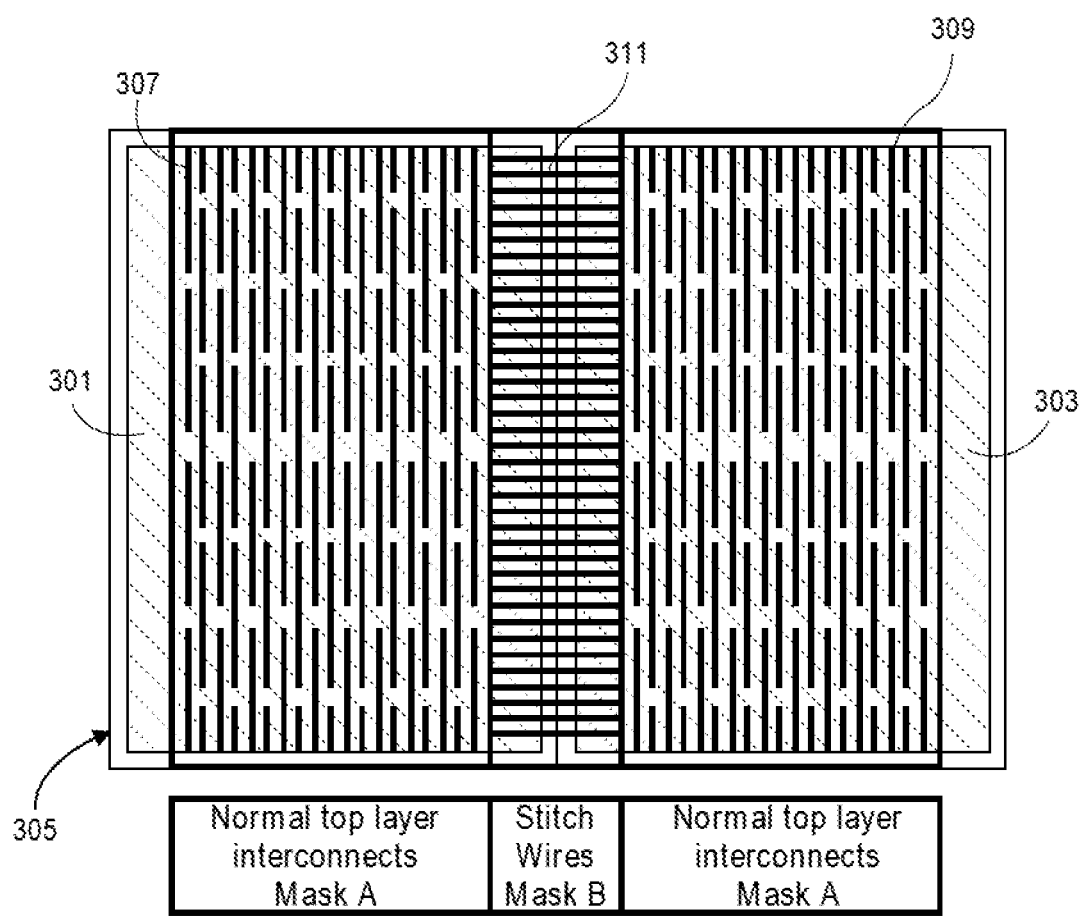
Figure 4A:
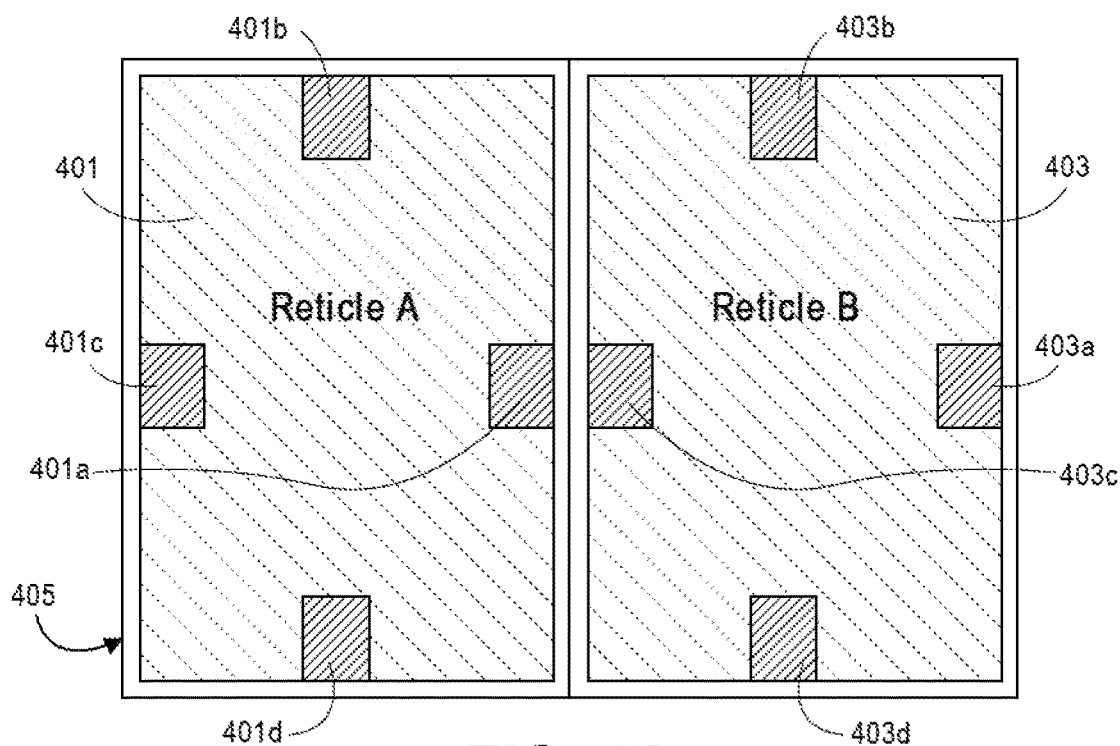
FIGS. 4A-4C illustrate the manner in which bridge die can be used to connect base die sections to form a functionally monolithic base die according to an embodiment.
Figure 4B:
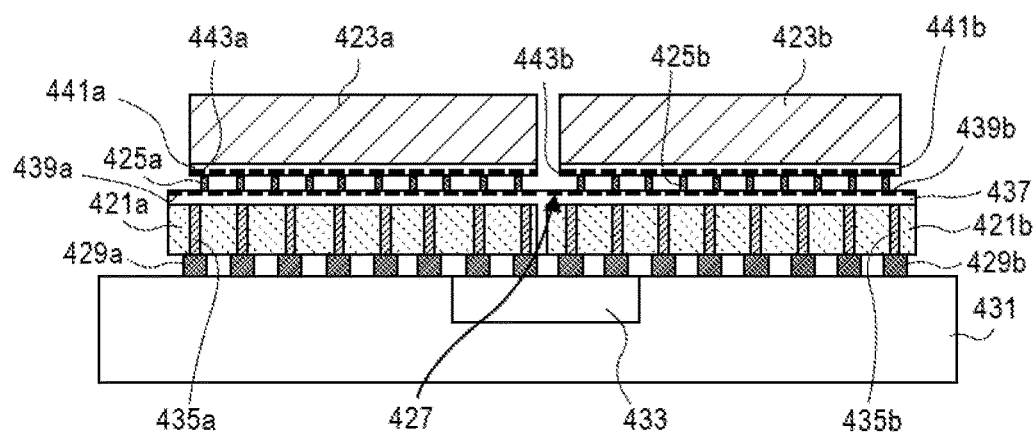
Figure 4C:
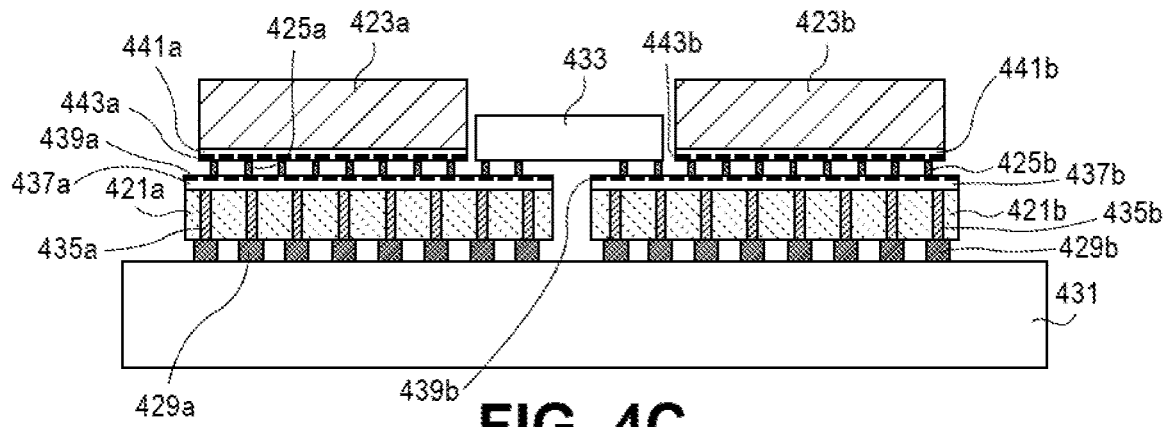

FIGS. 3A-3C illustrate the formation of a top layer interconnection structure used to connect base die sections to form a functionally monolithic base die according to an embodiment. FIGS. 4A-4C illustrate the manner in which bridge die connection circuitry can be formed and bridge die can be used to connect individual base die sections to form a functionally monolithic base die according to an embodiment. FIGS. 5A-5C illustrate examples in which bridge die can be used to connect individual base die sections and in which a top layer interconnection structure can be used to connect intact base die sections according to an embodiment.

In FIGS. 3A-3C, reticles are shown that are associated with first and second sections of a base die and illustrate the manner in which interconnect masks of the reticles are connected using a stitch mask according to an embodiment. FIG. 3A shows reticle 301, reticle 303 and scribe line 305. Referring to FIG. 3A, the reticle 301 and the reticle 303, are used to project interconnect mask patterns onto first and second sections of a base die. The scribe line 305 is formed on the die for use as a guide for a saw or other device that can be used to separate the sections. In FIG. 3A, reticles associated with a first and a second section of a base die are shown, however, the base die can be divided into other numbers of sections, corresponding to the number of sections into which the interconnect circuitry is divided. For example, a base die can be divided into 4, 6 or more sections (in FIGS. 5A-5C a microprocessor base die that is divided into 4 sections or "quadrants" is described). FIG. 3B shows a top layer interconnects mask 307 and a top layer interconnects mask 309 associated respectively with reticle 301 and reticle 303. In an embodiment, the top layer interconnects mask 307 and the top layer interconnects mask 309 are used to project a mask pattern onto a first base die section associated with reticle 301 and a second base die section associated with reticle 303. The mask pattern that is formed on the first base die section and the mask pattern that is formed on the second base die section are used to form top layer interconnects on the first base die section and top layer interconnects on the second base die section. In an embodiment, a space is left between the top layer interconnects on the first base die section and the top layer interconnects formed on the second base die section. However, in an embodiment, the top layer interconnects mask 307 and the top layer interconnects mask 309 can be connected by a stitch wires mask that is formed in the space. FIG. 3C shows such a stitch wires mask 311 that can be used to bridge the space between the top layer interconnects mask 307 and the top layer interconnects mask 309. In an embodiment, the stitch wires mask 311 is used in the projection of a stitch wires pattern onto a first base die section associated with the reticle 301 and a second base die section associated with the reticle 303 between the top layer interconnects on the first base die section and the top layer interconnects on the second base die section. The stitch wires patterns are used to form conductors on the first base die section and conductors on the second base die section that connects the top layer interconnects on the first base die section and the top layer interconnects on the second base die section. In FIG. 3C, the scribe line 305 shown as surrounding the reticle 301 and the reticle 303, circumscribes the patterns used to form the interconnections and the stitch mask on the first and the second sections of a base die. In an embodiment, when the interconnections and stitch wires connect the sections of a base die a functionally monolithic base die can be formed from those sections of the base die.

As shown in FIG. 3B and FIG. 3C, in an embodiment, the interconnections for respective sections of the base die can be formed from a uniform reticle. Moreover, in an embodiment, the mask patterns in the reticles associated with the sections of the base die can be the same. In other embodiments, the mask patterns associated with the sections of the base die can be different. In an embodiment, in contrast to previous approaches, the mesh or interconnect logic is not formed on such sections of the base die. In an embodiment, the mesh or interconnect logic is provided by bridge die. This approach addresses base die wastage and excessive cost. In an embodiment, this multi-purpose bridge die can either be implemented as active embedded bridges or as mounted "on die" interconnects as is discussed herein with reference to FIGS. 4A-4C.

FIG. 4A shows the areas of first and second reticles from which the mask patterns for connection circuitry for bridge die are transferred to first and second base die sections according to an embodiment. In FIG. 4A the first and second reticles correspond to first and second base die sections and include mask patterns for connection circuitry for bridge die that are transferred to the first and second base die sections according to an embodiment. FIG. 4A shows reticle A 401, reticle B 403, scribe line 405, connection circuitry mask for bridge die 401a-401d and connection circuitry mask for bridge die 403a-403d.

Referring to FIG. 4A, the connection circuitry mask for bridge die 401a-401d and the connection circuitry mask for bridge die 403a-403d are formed around the periphery of the reticle A 401 and the reticle B 403 respectively. In FIG. 4A, the connection circuitry masks for bridge die 401a and 403c are used to form connection circuitry for connecting a bridge die that connects a first and a second base die section. In an embodiment, the bridge die can be used in the low yield phase of the production ramp-up process to improve yield. In an embodiment, the bridge die used in this manner can improve yield by providing connectivity between base die sections that have been identified as functional. The identified base die sections can be connected using the bridge die to provide a functionally monolithic base die. In an embodiment, the bridge die includes the unique functional blocks of the top layer interconnects. In an embodiment, as compared to the bridge die that are shown in FIGS. 2C and 2D the unique functional blocks are eliminated from the top layer interconnects and are provided as a part of the bridge die. For example, in an embodiment, the bridge die can include interconnect or mesh logic that is not provided as part of the top layer interconnects that are formed as part of base die sections. In an embodiment, the bridge die can be either provided as active embedded bridges or as "on die" interconnection bridges. In an embodiment, when the bridge die are either provided as active embedded bridges or as "on die" interconnection bridges, the bridge die can be connected to circuitry in the die sections to which it is coupled that is designed to support die-to-die connection.

FIGS. 4B and 4C show package assemblies that include a multi-purpose bridge die that is used to connect a first base die section and a second base die section. The package assemblies shown in FIGS. 4B and 4C include components that are similar to those of the package assemblies shown in FIGS. 2C and 2D and thus a detailed description of such components are not made again here for purposes of clarity and brevity. For example, FIG. 4B shows base die section 421a, base die section 421b, first computation die 423a, second computation die 423b, bumps 425a and 425b, interconnect network 427, bumps 429a and 429b, package substrate 431, vias 435a and 435b, active device layer 437, conductive layers 439, active device layers 441a and 441b, and conductive layers 443a and 443b. Moreover, FIG. 4C shows in addition to common structures shown in FIG. 4B, active layer 437a, active layer 437b, conductive layers 439a and conductive layers 439b. FIGS. 4B and 4C show in addition to the components that are shown in FIGS. 2C and 2D, multi-purpose bridge die 433. FIGS. 4B and 4C illustrate embedded and on die bridge die configurations of multi-purpose bridge die 433 respectively.

Referring to FIGS. 4B and 4C, the multi-purpose bridge die 433 connects the first base die section 421a and the second base die section 421b. In an embodiment, in addition to interconnect conductors, the multi-purpose bridge die 433 can include interconnect or mesh logic. For example, in an embodiment, multi-purpose bridge die 433 can include routing logic and/or other types of logic. In an embodiment, the multi-purpose bridge die 433 can include an SRAM structure that incorporates interconnect layers. In an embodiment, the multi-purpose bridge die 433 can include filtering circuitry. For example, the multi-purpose bridge die 433 can include circuitry that can cache traffic for reuse. In an embodiment, the multi-purpose bridge die 433 can be formed from a plurality of semiconductor layers. For example, in an embodiment, the multi-purpose bridge die 433 can be formed from one, two, three, four or more semiconductor layers. In other embodiments, the multi-purpose bridge die 433 can be formed from other numbers of semiconductor layers. In an embodiment, the multi-purpose bridge die 433 can be formed from one, two, three, four or more SRAM layers. In other embodiments, the multi-purpose bridge die 433 can include other numbers of SRAM layers. In an embodiment, the multi-purpose bridge die 433 can be formed from silicon. In other embodiments, the multi-purpose bridge die 433 can be formed from other semiconductor material.

In an embodiment, the connections formed on the base die sections by the masks can be used in conjunction with the multi-purpose bridge die 433. In an embodiment, using the interconnections formed using the interconnections masks and the stitch mask in conjunction with one or more multi-purpose bridge die 433 can provide a functionally monolithic base die with greater performance capabilities than can be provided by a base die that includes base die sections only connected by interconnections formed using the interconnection masks and the stitch mask or by base die connected by bridge die alone.

FIG. 5A illustrates sectional lines along which a base die can be designed to be severable or separable to form individual base die sections and the sectional lines along which individual base die sections can be connected by multi-purpose bridge die according to an embodiment. FIG. 5A shows base die quadrants 501-507 and input/output (I/O) components 509a-509d. It should be appreciated that in an embodiment, the base die quadrants 501-507 are designed to be connectable by multi-purpose bridge die to components in addition to other base die quadrants such as the input/output (I/O) components 509a-509d shown in FIG. 5A. In FIG. 5A, the base die is divided into quadrants that if found to be defective can be replaced with functional quadrants. In an embodiment, the functional quadrants can be from the same wafer. In an embodiment, the functional quadrants can be found in a functional quadrant identification process. Referring to FIG. 5A, when yield is low, such as when the functional die on a wafer fall below a given threshold, functional quadrants can be identified and connected with one or more multi-purpose bridge die in order to form a completed base die structure. In this manner, a base die structure that is functionally monolithic can be provided from multi-purpose bridge die connected base die quadrants. In an embodiment, the threshold can be a defect density threshold. In an embodiment, one or more of the base die quadrants 501-507 can be connected using one or more multi-purpose bridge die. For example, in an embodiment, a single one of the base die quadrants may be connected to other functional base die quadrants using multi-purpose bridge die, and, in other embodiments, more than a single one of the base die quadrants can be connected to one or more other functional base die quadrants using one or more multi-purpose bridge die. FIG. 5B illustrates the manner in which base die quadrants that have been identified as functional can be organized to form a completed base structure. Referring to FIG. 5B, a set of base die quadrants are positioned such that die components located at the interfaces between the base die quadrants are brought into alignment. Thereafter, the multi-purpose bridge die can be positioned to connect the base die quadrants at these interfaces. In FIG. 5B, the thick border shown as surrounding the depicted set of base die quadrants, indicates that the base die quadrants are connectable to form a functionally monolithic base die. In an embodiment, one or more of these base die quadrants can be connected by multi-purpose bridge die to form the functionally monolithic base die. In an embodiment, the multi-purpose bridge die can be used in conjunction with the stitch mask described with reference to FIG. 3C. In an embodiment, using one or more multi-purpose bridge die in conjunction with the stitch mask can provide a functionally monolithic base die with greater performance capabilities than can be provided by a base die that includes base die quadrants only connected with a stitch mask or only connected by multi-purpose bridge die. In an embodiment, an individual base die quadrant can be added or removed to increase or decrease the level of performance that is provided. In this manner, the performance of a microprocessor can be calibrated to meet the needs of particular markets as is desired. For example, in an embodiment, performance can be calibrated to suit the needs of markets for the highest performance, less high performance and least high performance versions of a microprocessor that includes the base die. FIG. 5C shows a monolithic base die that includes four severable but intact base die quadrants identified as functional. In an embodiment, a stitch mask such as that described with reference to FIG. 3C can be used to connect the four base quadrants of the monolithic base die that are identified as functional. In an embodiment, such a monolithic base die structure is most likely to be identified in the high yield phase of production ramp up. Referring to FIG. 5C, in an embodiment, when such a base die is identified, it can be singulated intact with a stitch wires in place that provide die-to-die connection.

In an embodiment, based on the identification of defects in die on a wafer, designers can determine actions that include but are not limited to how the die are harvested, how the die are cut, how the die are connected, and the manner in which functions can be de-featured.

Figure 6A:
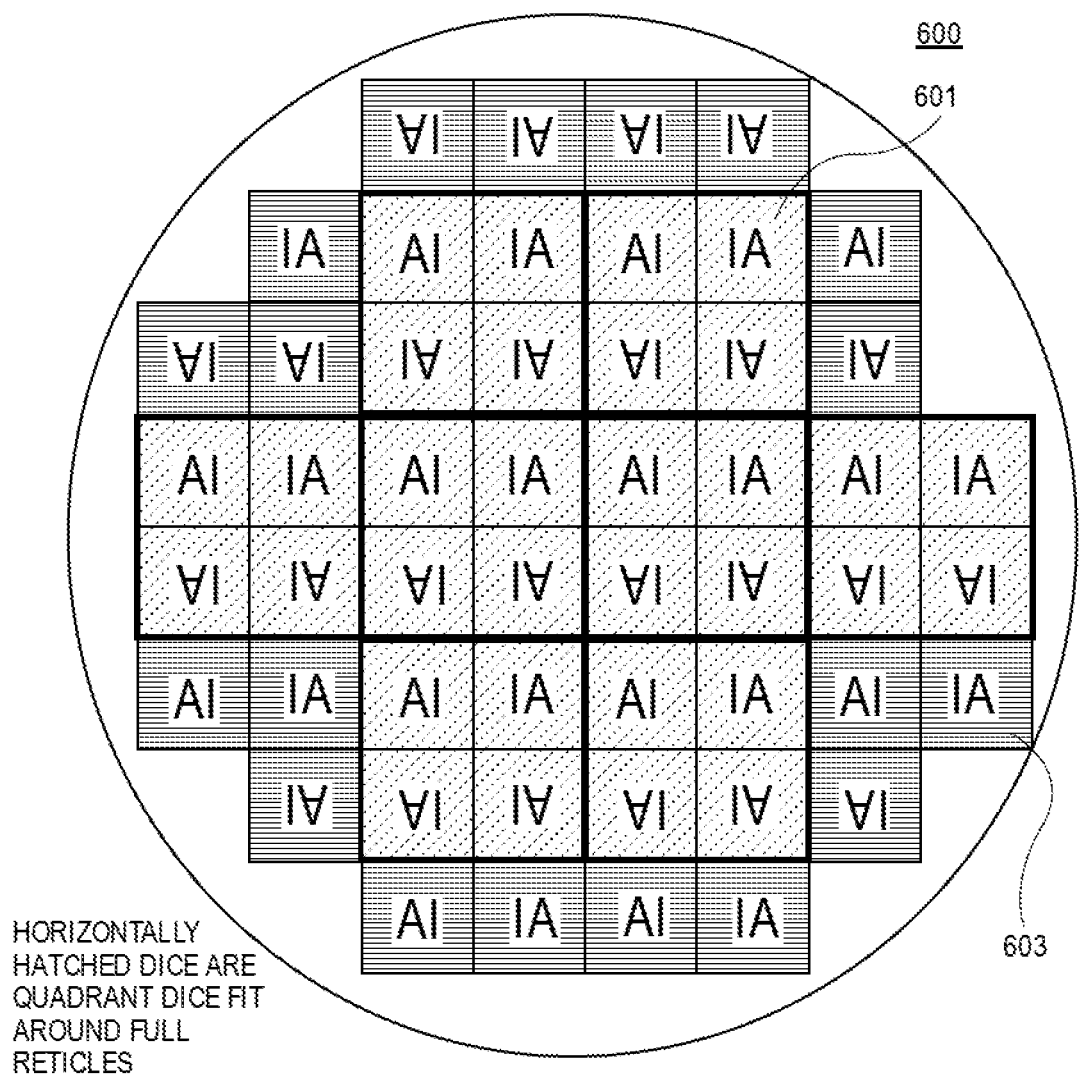
FIG. 6A illustrates a wafer that includes a plurality of die according to an embodiment.

FIG. 6A shows a wafer 600 that includes a plurality of die. The plurality of die includes die that are a part of full reticle die quadrants (a set of die quadrants that contain a microprocessor) in addition to individual die quadrants that are positioned around full reticles according to an embodiment. In the FIG. 6A embodiment, a full reticle includes four die quadrants. In other embodiments, a full reticle can include other numbers of die sections. FIG. 6A shows full reticle die quadrants 601 and individual die quadrants 603.

Referring to FIG. 6A, full reticle die quadrants that include, in an embodiment, four die quadrants, are formed in the central part of the wafer 600. The individual die quadrants 603 are formed around the edge of the wafer 600 where a full reticle cannot fit. In an embodiment, forming individual die quadrants around the edge of the wafer 600 can increase the number of die quadrants provided by the wafer 600 by ten percent. In other embodiments, forming individual die quadrants around the edge of the wafer 600 in this manner can increase the number of die quadrants provided by the wafer 600 by other amounts. In an embodiment, all known good die can be extracted from the wafer 600 such that die wastage is eliminated or reduced.

Figure 6B:
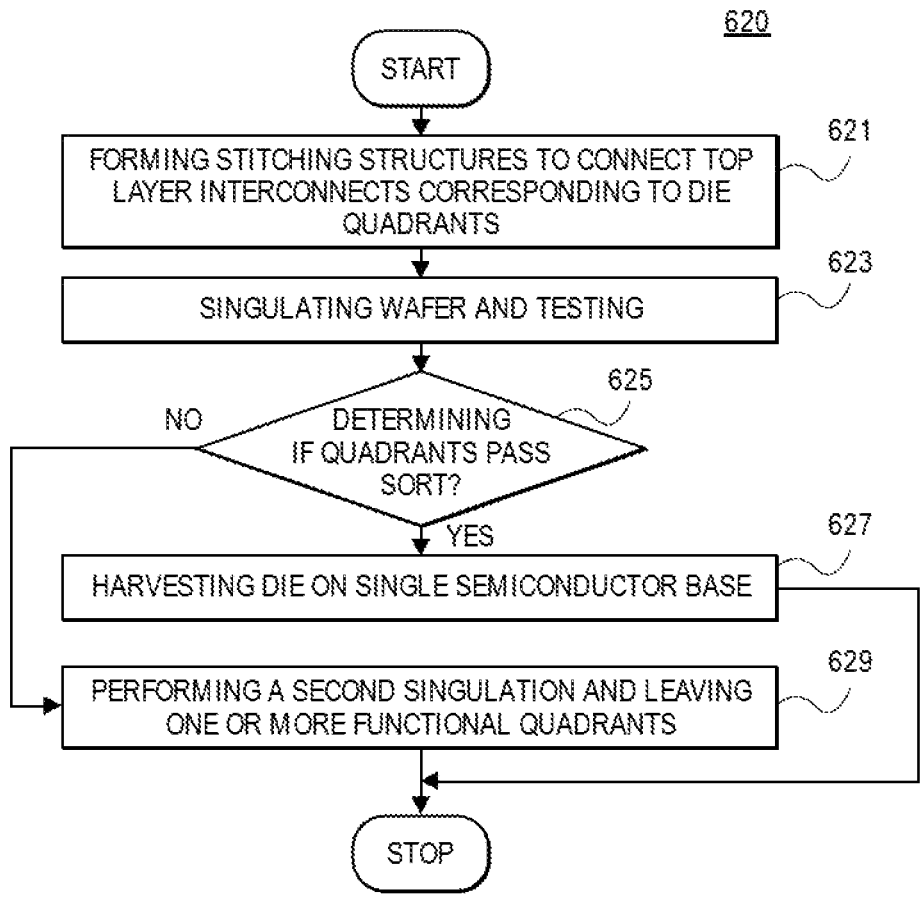
FIG. 6B is a flowchart of a die harvesting process according to an embodiment.
Figure 6C:
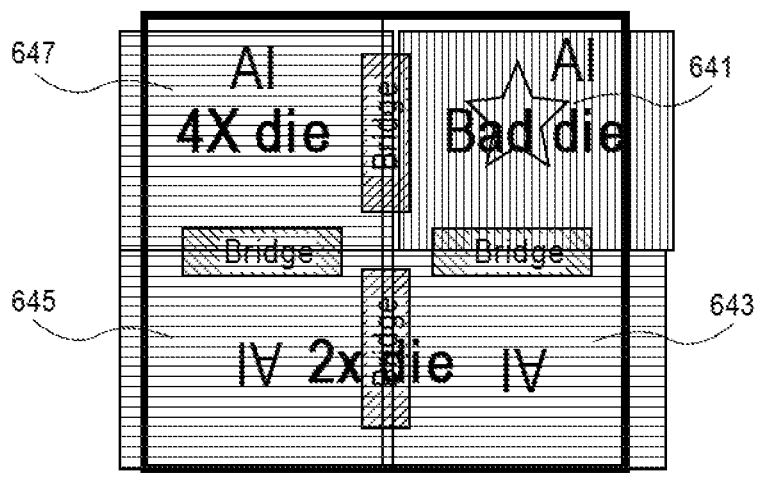
FIG. 6C illustrates die quadrants associated with a reticle according to an embodiment.

In an embodiment, an example base die reticle can include 4×220 mm² sized quadrants. In other embodiments, base die reticles having other sizes can be used. In an embodiment, the die on a wafer can be flipped and inverted. FIG. 6B is a flowchart of a die harvesting process according to an embodiment. Referring to FIG. 6B, the process includes, at 621, forming stitching structures to connect top layer interconnects corresponding to die quadrants of sets of die quadrants to provide die-to-die connection without a bridge on a wafer. In an embodiment, the stitching structures can be formed in a layer above the top layer interconnects. In other embodiments, the stitching structures can be formed in other manners. At 623, singulating the wafer into sets of die quadrants and testing the sets of die quadrants. In an embodiment the wafer is singulated into 2×2 macro-dice. In other embodiments, the wafer can be singulated into macro-dice having other structures. At 625, determining if the quadrants pass sort. If all quadrants of a set of die quadrants pass sort, at 627, harvesting the set of die quadrants on a single semiconductor base. In an embodiment, the set of die quadrants can be harvested as a 1× (1 part) macro base where the base semiconductor is left intact. In an embodiment, in this case the socket is built for a single semiconductor base die for best performance. In an embodiment, the socket can be built for a single silicon base die. If all four quadrants do not pass sort, at 629, performing a second pass singulation and leaving one or more functional quadrants of the set of die quadrants. In an embodiment, a socket can be built to accommodate a 4× (4 part) base die in order to maximize yield. For 220 mm² base die, an extra 10% of quadrants can be fit into space around the edge of the wafer where a full reticle does not fit. In other embodiments, other sized die can be fit into space around the edge of the wafer where a full reticle does not fit. FIG. 6C show die quadrants 641-647 associated with a reticle. Referring to FIG. 6C, one of the quadrant die 641 has been identified as being bad (non-functional, defective, etc.) in a process such as that described with reference to FIG. 6B. The other three dies of the four dies 643-647 are identified as being good (functional, not defective etc.). In an embodiment, the three good die can be packaged and marketed as a lower performance product for buyers who do not desire the higher performance versions of the microprocessor. In another embodiment, a functional die can be identified from the wafer and connected by one or more bridge die to one or more of the dies 643-647 and be packaged and marketed as a product.

Figure 7:
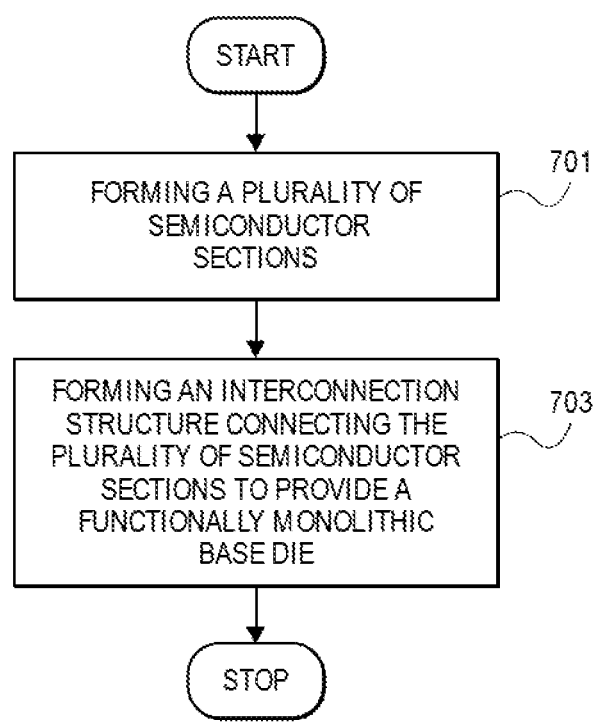
FIG. 7 shows a flowchart of a method for providing high performance microprocessor die according to an embodiment.

FIG. 7 shows a flowchart of a method for providing a die architecture high yield and performance microprocessors. Referring to FIG. 7, the method includes at 701, forming a plurality of separable semiconductor sections. At 703, forming an interconnection structure that connects the plurality of separable semiconductor sections to provide a functionally monolithic base die. In an embodiment, the forming the interconnection structure includes, forming one or more bridge die to connect one or more of the plurality of separable semiconductor sections to one or more other of the plurality of separable semiconductor sections, or forming a top layer interconnect structure to connect the plurality of separable semiconductor sections or forming both the one or more bridge die and the top layer interconnect structure.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 8:
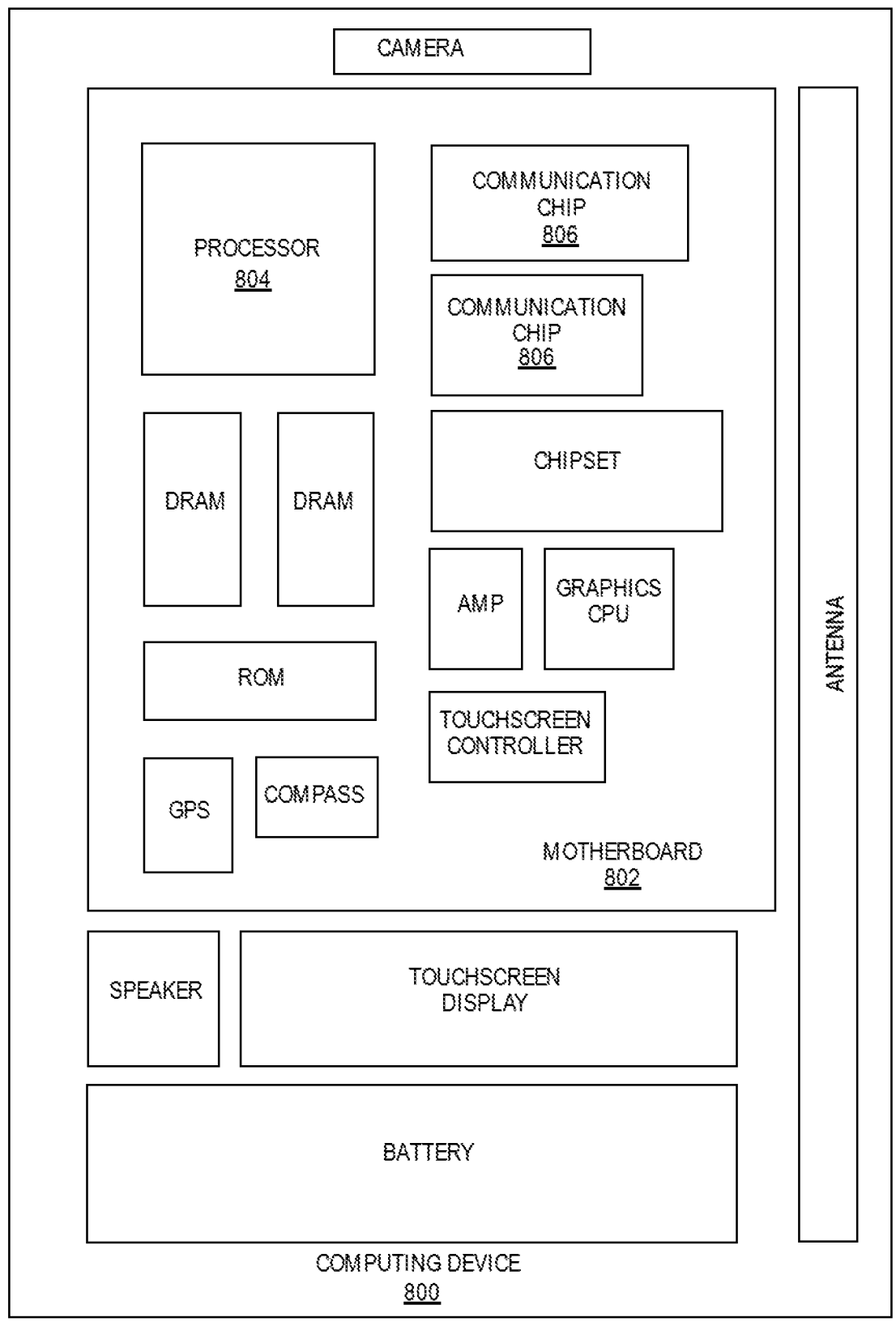
FIG. 8 illustrates a computing device in accordance with one implementation of an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
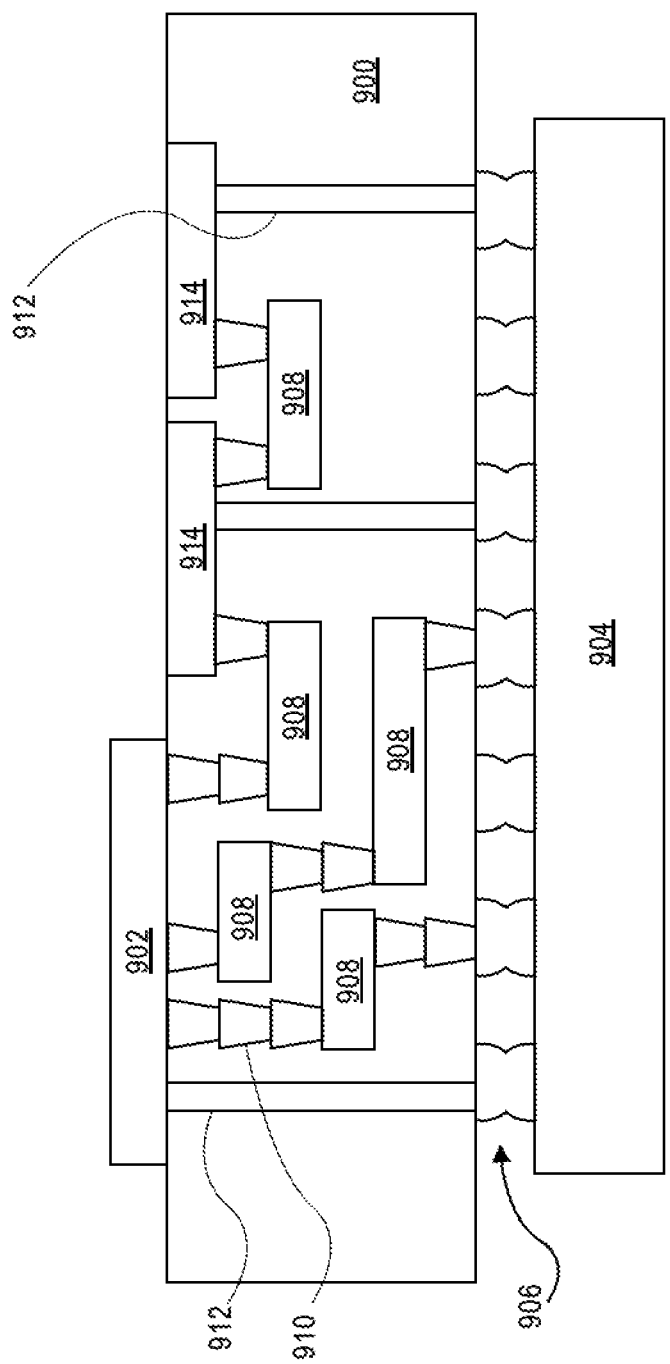
FIG. 9 illustrates an interposer that includes one or more implementations of an embodiment.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

Example Embodiment 1

A die including a plurality of semiconductor sections, an interconnection structure connecting the plurality of semiconductor sections to provide a functionally monolithic base die, the interconnection structure includes: one or more bridge die that connect one or more of the plurality of semiconductor sections to one or more other semiconductor sections, or a top layer interconnect structure that connects the plurality of semiconductor sections or both the one or more bridge die and the top layer interconnect structure.

Example Embodiment 2

The die of example embodiment 1, wherein the top layer interconnect structure includes stitch wires that connect top layer interconnects that correspond to a first semiconductor section to top layer interconnects that correspond to a second semiconductor section.

Example Embodiment 3

The die of example embodiment 1, wherein the bridge die is connected above first and second semiconductor sections.

Example Embodiment 4

The die of example embodiment 1, wherein the bridge die is connected underneath first and second semiconductor sections.

Example Embodiment 5

The die of example embodiment 1, wherein the bridge die includes interconnect input/output (I/O) logic.

Example Embodiment 6

The die of example embodiment 1, wherein the bridge die includes a plurality of SRAM semiconductor layers.

Example Embodiment 7

The die of example embodiment 1, 2, 3, 4, 5 or 6 wherein the plurality of semiconductor sections includes separable quadrants.

Example Embodiment 8

A package includes a package substrate and a die including: a plurality of semiconductor sections, an interconnection structure connecting the plurality of semiconductor sections to provide a functionally monolithic base die, the interconnection structure includes: one or more bridge die that connect one or more of the plurality of semiconductor sections to one or more other semiconductor sections or a top layer interconnect structure that connects the plurality of semiconductor sections or both the one or more bridge die and the top layer interconnect structure. The package also includes a computation die above each of the semiconductor sections.

Example Embodiment 9

The package of example embodiment 8, wherein the top layer interconnect structure includes stitch wires that connect top layer interconnects that correspond to a first semiconductor section to top layer interconnects that correspond to a second semiconductor section.

Example Embodiment 10

The package of example embodiment 8, wherein the bridge die is connected above first and second semiconductor sections.

Example Embodiment 11

The package of example embodiment 8, wherein the bridge die is connected underneath first and second semiconductor sections.

Example Embodiment 12

The package of example embodiment 8, wherein the bridge die includes interconnect input/output (I/O) logic.

Example Embodiment 13

The package of example embodiment 8, wherein the bridge die includes a plurality of SRAM semiconductor layers.

Example Embodiment 14

The package of example embodiment 8, 9, 10, 11, 12 or 13 wherein the plurality of semiconductor sections includes separable quadrants.

Example Embodiment 15

A method, comprising forming stitching structures to connect interconnects corresponding to die quadrants of sets of die quadrants on a wafer, singulating the wafer into the sets of die quadrants and testing the sets of die quadrants, determining if all of the quadrants of the sets of die quadrants pass testing, if all of the quadrants of a set of die quadrants pass testing, harvesting the set of die quadrants on a single semiconductor base, and if all of the quadrants of the set of die quadrants do not pass testing, performing a second singulation and leaving one or more functional die quadrants of the set of die quadrants.

Example Embodiment 16

The method of example embodiment 15, further comprising: forming one or more bridge die to connect the one or more functional die quadrants to one or more other functional die quadrants.

Example Embodiment 17

The method of example embodiment 15, wherein the forming the stitching structures include forming stitch wires that connect top layer interconnects that correspond to a first die quadrant to top layer interconnects that correspond to a second die quadrant.

Example Embodiment 18

The method of example embodiment 16, wherein the forming the one or more bridge die includes connecting the bridge die above the one or more functional die quadrants and the one or more other functional die quadrants.

Example Embodiment 19

The method of example embodiment 16, wherein the forming the one or more bridge die includes connecting the bridge die underneath the one or more functional die quadrants and the one or more other functional die quadrants.

Example Embodiment 20

The method of example embodiment 15, 16, 17, 18 or 19 wherein forming the one or more bridge die includes forming an interconnect to input/output (I/O) logic.

What is claimed is:
1. A die, comprising:
  a plurality of semiconductor sections; and
  an interconnection structure connecting the plurality of semiconductor sections to provide a functionally monolithic base die, wherein the interconnection structure includes a top layer interconnect structure that connects the plurality of semiconductor sections, and the interconnection structure includes a bridge die, the bridge die on a side of the plurality of semiconductor sections opposite the top layer interconnect structure.
2. The die of claim 1, wherein the top layer interconnect structure includes stitch wires that connect top layer interconnects that correspond to a first semiconductor section to top layer interconnects that correspond to a second semiconductor section.
3. The die of claim 1, wherein the bridge die is connected above first and second semiconductor sections.

4. The die of claim 1, wherein the bridge die is connected underneath first and second semiconductor sections.

5. The die of claim 1, wherein the bridge die includes interconnect input/output (I/O) logic.

6. The die of claim 1, wherein the bridge die includes a plurality of SRAM semiconductor layers.

7. The die of claim 1, wherein the plurality of semiconductor sections includes separable quadrants.

8. A package, comprising:
a package substrate;
a die on the package substrate including:
a plurality of semiconductor sections; and
an interconnection structure connecting the plurality of semiconductor sections to provide a functionally monolithic base die, wherein the interconnection structure includes a top layer interconnect structure that connects the plurality of semiconductor sections, and the interconnection structure includes a bridge die, the bridge die on a side of the plurality of semiconductor sections opposite the top layer interconnect structure; and
a computation die above each of the semiconductor sections.

9. The package of claim 8, wherein the top layer interconnect structure includes stitch wires that connect top layer interconnects that correspond to a first semiconductor section to top layer interconnects that correspond to a second semiconductor section.

10. The package of claim 8, wherein the bridge die is connected above first and second semiconductor sections.

11. The package of claim 8, wherein the bridge die is connected underneath first and second semiconductor sections.

12. The package of claim 8, wherein the bridge die includes interconnect input/output (I/O) logic.

13. The package of claim 8, wherein the bridge die includes a plurality of SRAM semiconductor layers.

14. The package of claim 8, wherein the plurality of semiconductor sections includes separable quadrants.

15. A method, comprising:
forming stitching structures to connect interconnects corresponding to die quadrants of sets of die quadrants on a wafer;
singulating the wafer into the sets of die quadrants and testing the sets of die quadrants;
determining if all of the quadrants of the sets of die quadrants pass testing;
if all of the quadrants of a set of die quadrants pass testing, harvesting the set of die quadrants on a single semiconductor base; and
if all of the quadrants of the set of die quadrants do not pass testing, performing a second singulation and leaving one or more functional die quadrants of the set of die quadrants.

16. The method of claim 15, further comprising:
forming one or more bridge die to connect the one or more functional die quadrants to one or more other functional die quadrants.

17. The method of claim 15, wherein forming the stitching structures include forming stitch wires that connect top layer interconnects that correspond to a first die quadrant to top layer interconnects that correspond to a second die quadrant.

18. The method of claim 16, wherein the forming the one or more bridge die includes connecting the bridge die above the one or more functional die quadrants and the one or more other functional die quadrants.

19. The method of claim 16, wherein the forming the one or more bridge die includes connecting the bridge die underneath the one or more functional die quadrants and the one or more other functional die quadrants.

20. The method of claim 16, wherein forming the one or more bridge die includes forming an interconnect to input/output (I/O) logic.

* * * * *